(12) United States Patent
Tsironis

(10) Patent No.: US 12,199,592 B1
(45) Date of Patent: Jan. 14, 2025

(54) TWO PROBE LOW PROFILE TUNER

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 235 days.

(21) Appl. No.: 17/981,415

(22) Filed: Nov. 5, 2022

(51) Int. Cl.
| | | |
|---|---|---|
| *H03H 7/40* | (2006.01) |
| *G01R 1/26* | (2006.01) |
| *H03H 17/00* | (2006.01) |
| *H03J 1/06* | (2006.01) |
| *H01P 5/04* | (2006.01) |

(52) U.S. Cl.
CPC .............. *H03J 1/06* (2013.01); *G01R 1/26* (2013.01); *H03H 7/40* (2013.01); *H03H 17/0045* (2013.01); *H01P 5/04* (2013.01)

(58) Field of Classification Search
CPC .... H03H 7/38; H03H 7/40; H01P 5/04; H01P 5/00; H01P 1/00; H01P 3/023; G01R 27/32; G01R 27/04; G01R 31/2822; G01R 31/282; G01R 31/2601; G01R 1/26; G01R 1/24; G01R 35/005
See application file for complete search history.

(56) References Cited

U.S. PATENT DOCUMENTS

| | | | |
|---|---|---|---|
| 5,910,754 | A | 6/1999 | Simpson et al. |
| 6,674,293 | B1 | 1/2004 | Tsironis |
| 7,595,709 | B1 | 9/2009 | Boulerne |
| 8,854,162 | B1 | 10/2014 | Tsironis |
| 9,257,963 | B1 | 2/2016 | Tsironis |
| 9,625,556 | B1 | 4/2017 | Tsironis |
| 10,097,165 | B1 * | 10/2018 | Tsironis .................. H01P 5/04 |
| 11,327,101 | B1 | 5/2022 | Tsironis |

OTHER PUBLICATIONS

"Load Pull Measurements" [online], Wikipedia [retrieved on Nov. 18, 2016] Retrieved from Internet <URL:http://en.wikipedia.org/wiki/Load_pull>.
"Computer Controlled Microwave Tuner", Product Note 41, Focus Microwaves, Jan. 1998.
"Linear Actuator" [online], Wikipedia [retrieved on Apr. 25, 2020] Retrieved from Internet <URL: https://en.wikipedia.org/wiki/Linear_actuator>.
"Lecture 20: Transmission (ABCD) Matrix" [online], EE 481/581—Microwave Engineering, Course Syllabus [retrieved on Jul. 13, 2015] Retrieved from Internet <URL: http://whites.sdsmt.edu/classes/ee481/notes/481Lecture20>.

* cited by examiner

*Primary Examiner* — Stephen E. Jones

(57) ABSTRACT

A low profile two probe load-pull slide screw impedance tuner uses two tuning probes sharing the same slabline; they are inserted diametrically at fixed depth (distance from the center conductor) from both sides into the channel and move only horizontally along the slabline. The tuner does not have adjustable vertical axes controlling the penetration of the probes and its low profile is optimized for on-wafer operations. The carriages holding the probes are moved at high speed along the slabline using linear electric actuators. The "S" shaped center conductor allows for a neutral zero 50 Ohm state. An efficient de-embedding calibration method serves speeding up the measurement procedure additionally.

7 Claims, 12 Drawing Sheets

FIG. 10: Prior art (ref. 11)

TWO PROBE LOW PROFILE TUNER

PRIORITY CLAIM

Not Applicable

CROSS-REFERENCE TO RELATED ARTICLES

1. "Load Pull Measurements" [online], Wikipedia [retrieved on Nov. 18, 2016] Retrieved from Internet <URL: http://en.wikipedia.org/wiki/Load_pull>
2. "Computer Controlled Microwave Tuner-CCMT", Product Note 41, Focus Microwaves January 1998.
3. Boulerne P., U.S. Pat. No. 7,595,709, Multiple-Carriage High Gamma Tuner", FIGS. 7 and 7' and Column 4 lines 63ff and column 5 lines 1-5.
4. Tsironis C., U.S. Pat. No. 6,674,293, "Adaptable Pre-Matched Tuner System and Method".
5. Tsironis C., U.S. Pat. No. 11,327,101, "Integrated Pre-matching module for Impedance tuner", FIG. 13.
6. "Linear Actuator" [online], Wikipedia [retrieved on Apr. 25, 2020] Retrieved from Internet <URL: https://en.wikipedia.org/wiki/Linear_actuator>
7. Tsironis C., U.S. Pat. No. 9,257,963, "Impedance Tuners with Rotating Probes", FIG. 15.
8. Tsironis C., U.S. Pat. No. 9,625,556, "Method for Calibration and Tuning with Impedance Tuners".
9. "Lecture 20: Transmission (ABCD) Matrix" [online], EE 481/581-Microwave Engineering, Course Syllabus [retrieved on Jul. 13, 2015] Retrieved from Internet <URL: http://whites.sdsmt.edu/classes/ee481/notes/481Lecture20>
10. Simpson, G. et al. U.S. Pat. No. 5,910,754, "Reduced height waveguide tuner for impedance matching", FIG. 8.
11. Tsironis, C. U.S. Pat. No. 8,854,162, "Method for preventing electrical short in impedance tuners using mechanical stop", FIGS. 5 and 8 to 14.

BACKGROUND OF THE INVENTION

This invention relates to RF load and source pull testing of medium and high-power RF transistors and amplifiers using remote controlled electro-mechanical impedance tuners.

A popular method for testing and characterizing such microwave components (transistors) in the non-linear region of operation is "load pull" (see ref. 1). Load pull is a RF device measurement technique employing microwave impedance tuners (see ref. 2) and other microwave test equipment as shown in FIG. 1. The microwave tuners 2, 4 are used in order to manipulate the microwave impedance conditions under which the Device Under Test (DUT, or transistor, 3) is tested; the test signal is provided by a signal source 1 and the out-coming power is measured by a power meter 5; the whole is controlled by a PC controller 6, which has electronic interface to communicate with the instruments 1, 5 and the tuners 2, 4 using digital control and communication cables 7, 8 and 9.

DESCRIPTION OF PRIOR ART

Load-pull impedance tuners use, in general, a low loss transmission line 30 (parallel plate or slabline), FIG. 3, and one or more conductive tuning elements (tuning probes or slugs, 32 and FIG. 2); the tuning probes 21 are attached to and controlled by complex adjustable high precision vertical axes 34 (see ref. 10) and are inserted into the slabline 24, approaching the center conductor 23, 31 and moved along the axis of the slabline; this movement of the tuning probe creates capacitive coupling and a controllable variable reactance, allowing the synthesis of various impedances (or reflection factors) covering parts, up to the quasi totality, of the Smith chart (the polar impedance mapping display showing the normalized reflection factor area). The relation between reflection factor Γ and impedance Z is given by $Γ=(Z-Zo)/(Z+Zo)$, where $Z=R+jX$ and Zo is the characteristic impedance. A typical value used for Zo is 50 Ohm.

When parallelepiped metallic tuning probes (slugs) 21, FIG. 2, with a concave bottom approach the center conductor 23, they capture and deform the electric field, which is concentrated in the area between the center conductor and the ground planes of the slabline 24. This field deformation allows creating the high and controllable reflection factors. The main disadvantage of this embodiment is the requirement of high precision and resolution and, by consequence, tall and cumbersome vertical probe movement mechanisms 34 (see ref. 10), because most of the field capturing effect occurs when the probe is very close to the center conductor (FIG. 15 in ref. 7). This movement process slows down the tuning procedure for two reasons: (a) when the probe is away from the center conductor, the vertical probe movement is lengthy and much less effective, while the vertical moving speed is the same and (b) enhanced positioning accuracy and resolution is required all the way due to high tuning sensitivity in the high reflection area, when the probe is very close to the center conductor (FIG. 10).

Related prior art that teaches fixed penetration tuning probes also requires some kind of adjustable attenuation in line with the first tuning probe to mitigate the un-avoidable wideband high reflection, which risks creating spurious oscillations of the DUT, thus requiring, at least for the attenuator, some kind of vertical movement control. Neither relevant prior art ref. 3 or 4 teaches a tuner calibration method for overlapping tuning probes (ref. 3 does not teach calibration method at all and ref. 4 does not teach calibration method for alternatively swapping tuning sections in a shared transmission slabline structure); this overlapping structure, though, is essential and compatible with the proposed low profile, compact tuner size and high speed de-embedding tuner calibration and operation (see ref. 8). The issue is that the second embodiment included in this invention, i.e., a full calibration, would require, typically, measuring 100×100=10,000 points, whereas the herein disclosed de-embedding calibration requires only 100+100=200 points (50 times faster).

BRIEF SUMMARY OF THE INVENTION

The invention claims a new slide screw load pull tuner type. The configuration, different from prior art, uses horizontal-only high-speed tuning probe movement techniques with wideband neutral (50 Ohm) tuning state and a preferred fast custom de-embedding calibration method. Once the tuner is properly calibrated, prior art impedance synthesis (tuning) methods are applicable (see ref. 8).

The tuner itself uses a low loss slabline, arranged flat on the side (FIG. 8), in order to reach a very low profile; such low-profile tuners are needed for on-wafer integrations for avoiding a mechanical conflict with the microscope (see ref. 5). The tuning probes 82, 83 are mounted using rolling ball bearings 84 or sliders on remotely controlled horizontally (along the slabline) moving carriages 85, 86 and penetrate into the channel between the slabline sidewalls 80 always at the same depth, or the same distance to the center conductor 81, which corresponds to constant reflection amplitude and variable phase. This eliminates the need for an elaborate adjustable high precision vertical axis (see ref. 10).

The carriages are controlled either using high-resolution high-speed electric stepper actuators or stepper motors and ACME screws 87, 88, without additional sophisticated translation mechanisms (see ref. 6) thus also eliminating additional control gear. Last, but not least, the tuning mechanism, liberated from cumbersome and expensive high resolution vertical probe control and movement delays, benefits also from inherent lower tuning error sensitivity to mechanical probe positioning tolerances close to |T|≈1 (FIG. 10 and FIG. 5 in ref. 11).

BRIEF DESCRIPTION OF THE SEVERAL VIEWS OF THE DRAWINGS

The invention and its mode of operation will be more clearly understood from the following detailed description when read with the appended drawings in which.

DETAILED DESCRIPTION OF THE INVENTION

Figure 1:
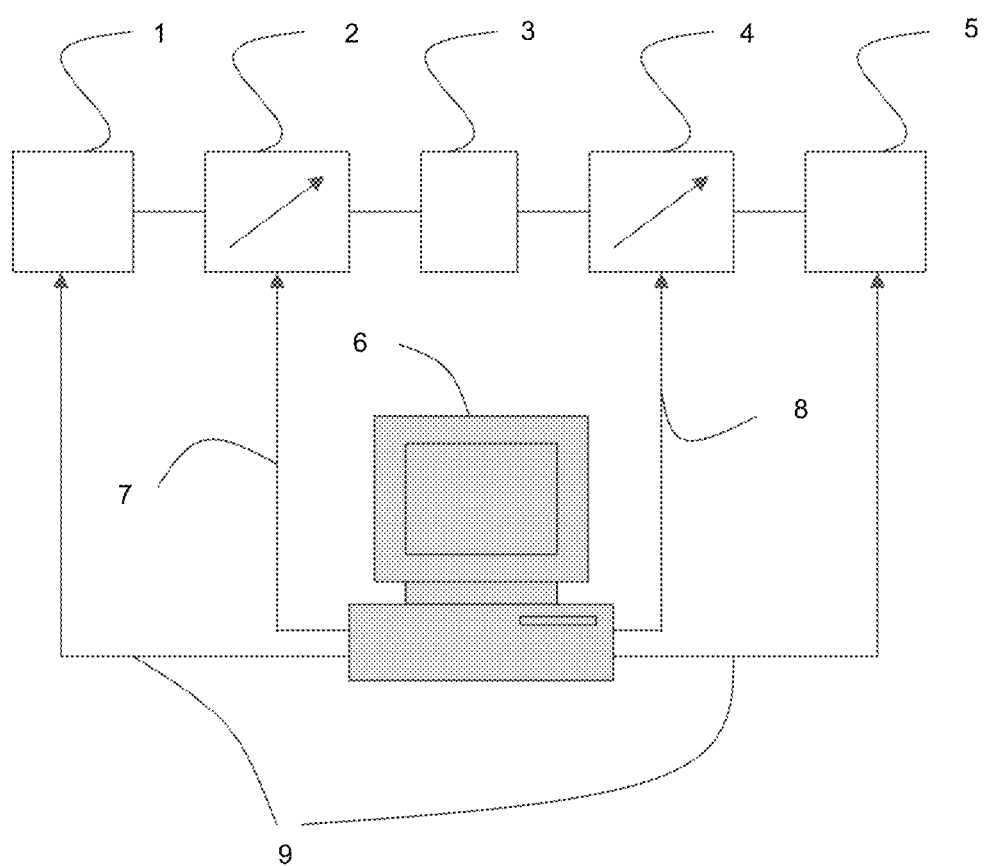
FIG. 1 depicts prior art, a typical automated load pull test system.
Figure 2:
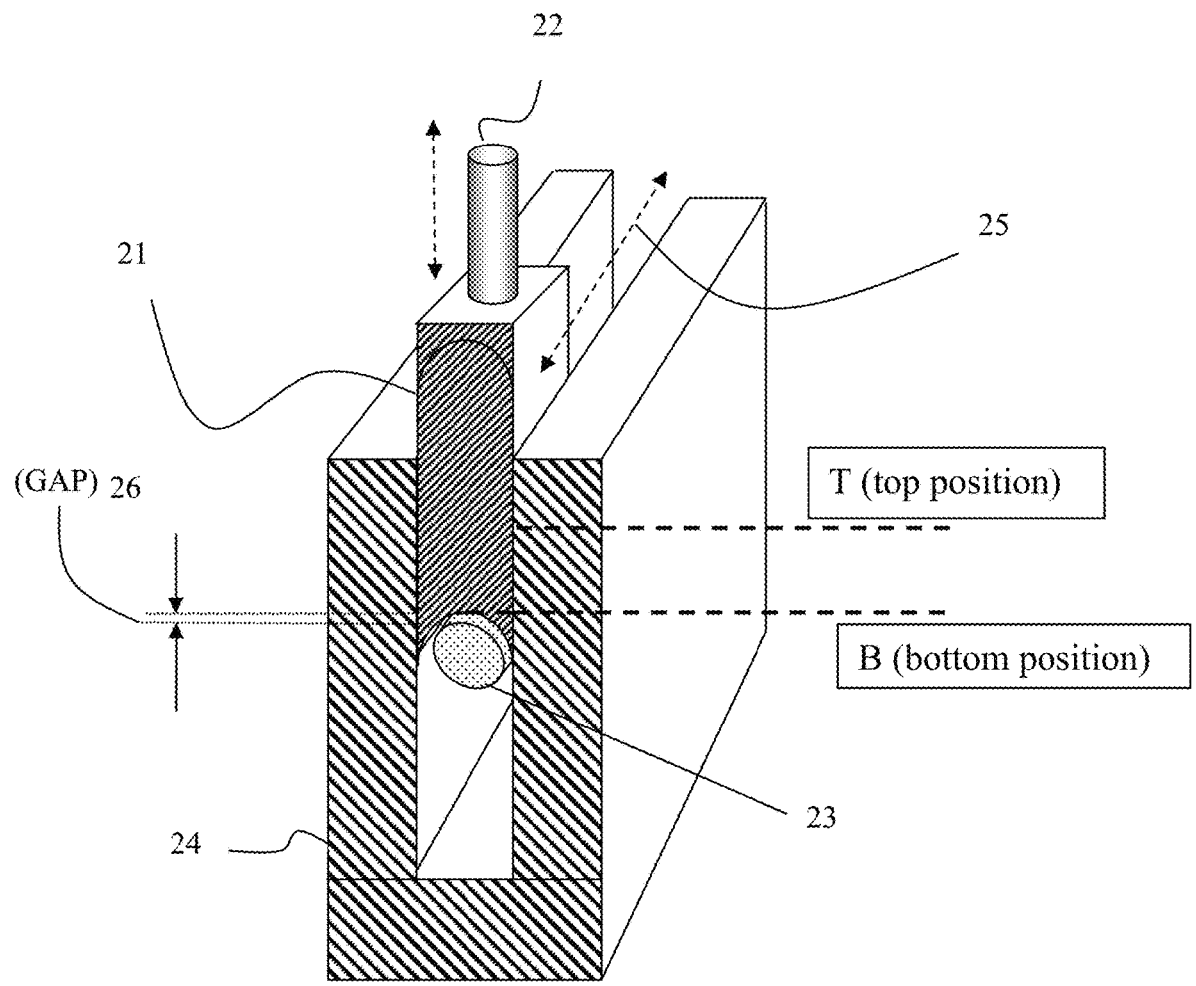
FIG. 2 depicts prior art, a perspective view of a vertically adjustable RF parallelepiped tuning probe (slug) and the relevant dimensions and parameters of the operation.
Figure 3:
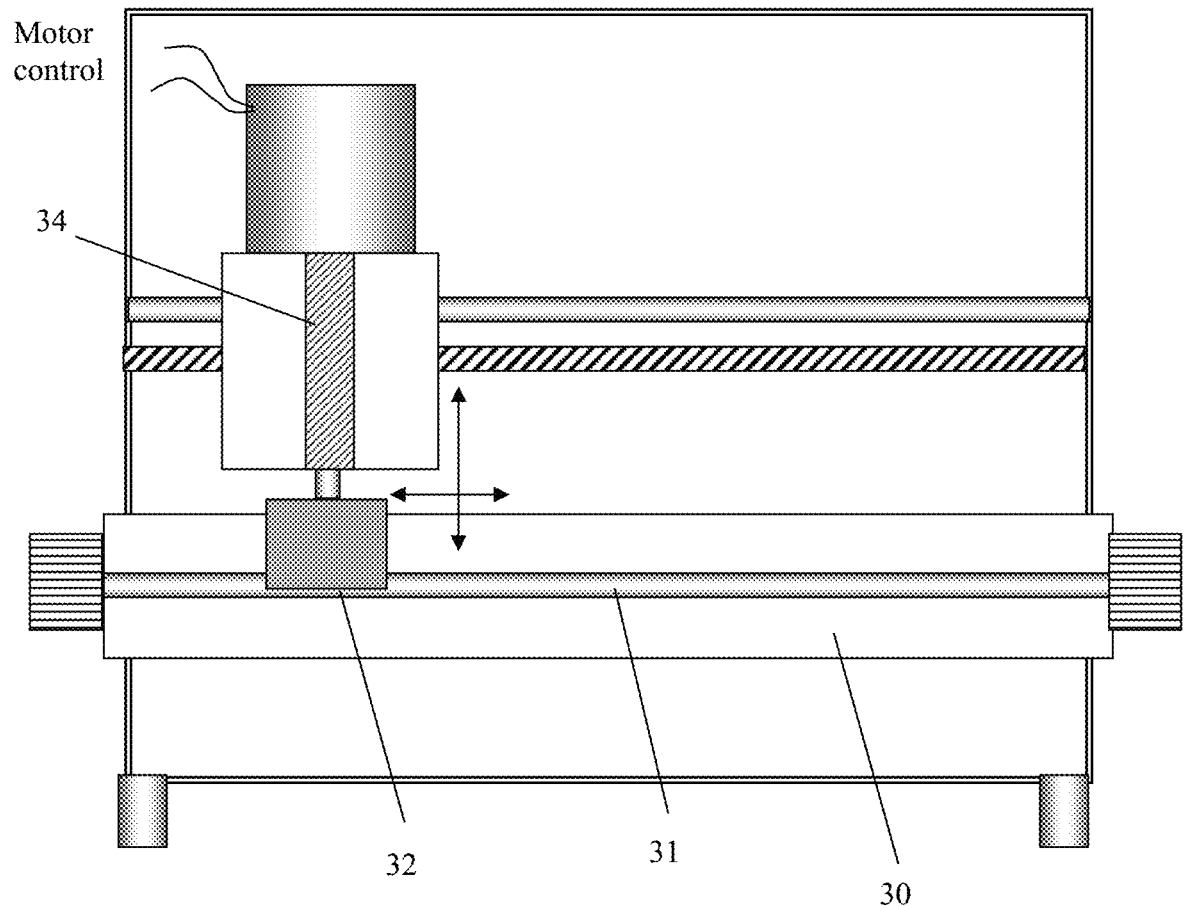
FIG. 3 depicts prior art, front view of a single-carriage single-probe slide screw tuner.
Figure 5:
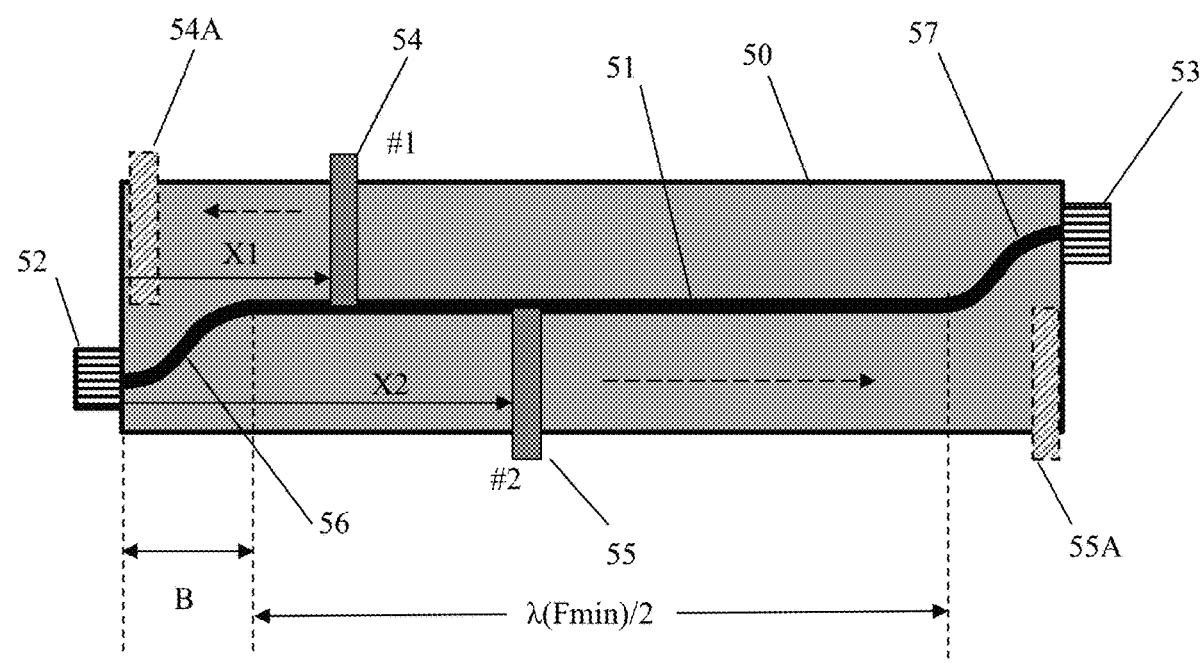
FIG. 5 depicts a detailed front view of the shared-slabline fixed-penetration two-probe tuner with neutral state (50 Ohm) wideband capability.
Figure 6:
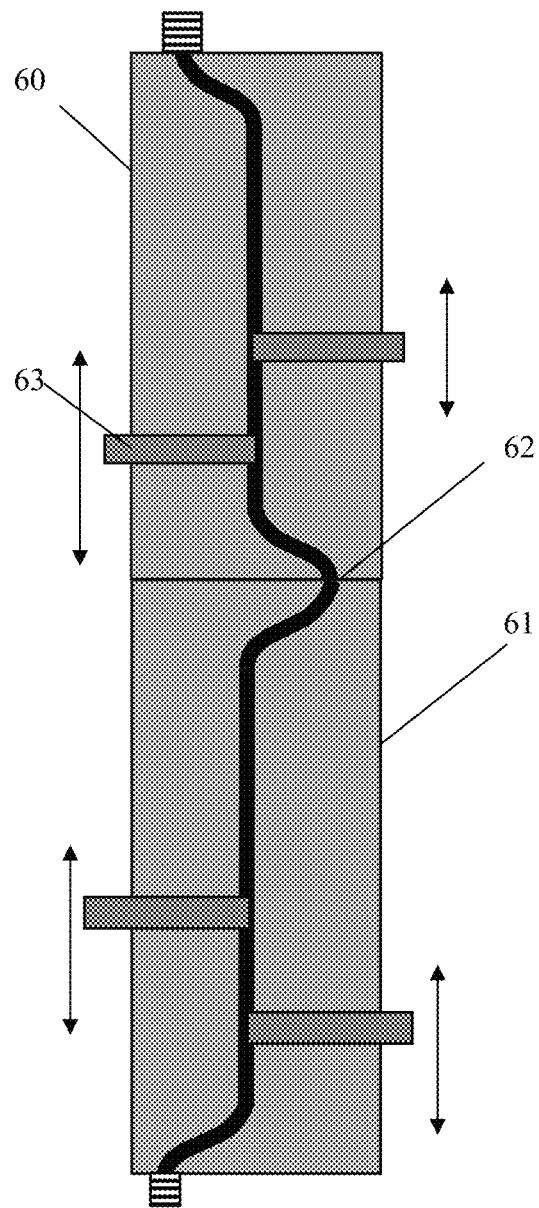
FIG. 6 depicts a shared-slabline fixed-penetration two-probe tuner, two stage (harmonic) low profile tuner with neutral state (50 Ohm) wideband capability.

This invention discloses a radio frequency (RF, microwave), computer-controlled impedance tuner and the associated calibration method, suitable for load pull measurements. The tuner (FIGS. 5, 6 and 8) uses a low loss transmission airline (slabline) 50, which includes two parallel conducting (metallic or metallized) sidewalls 80 (FIG. 8) forming a straight channel and a, typically but not exclusively, cylindrical center conductor 51, 81. The center conductor terminates at the two ends of the slabline, the input or test port 52 facing the DUT, and the output or idle port 53 facing the load. Two parallelepiped tuning probes 54 and 55 are inserted opposite (diametrically) to each-other from the top and the bottom (FIG. 8) into the slabline channel at fixed depth 26 (FIG. 2) and can be moved only horizontally 43, 47 (FIG. 4) along the slabline; each probe creates, as it moves, at its own reference plane concentric reflection factor circles 92 on the Smith chart (FIG. 9). The total reflection factor 90 is created by a planetary epicycloid superposition of the two reflection factor vectors (one circle rotates around a point at the periphery of the other) and can be seen in FIG. 9 (see ref. 4, FIG. 8b).

Figure 10:
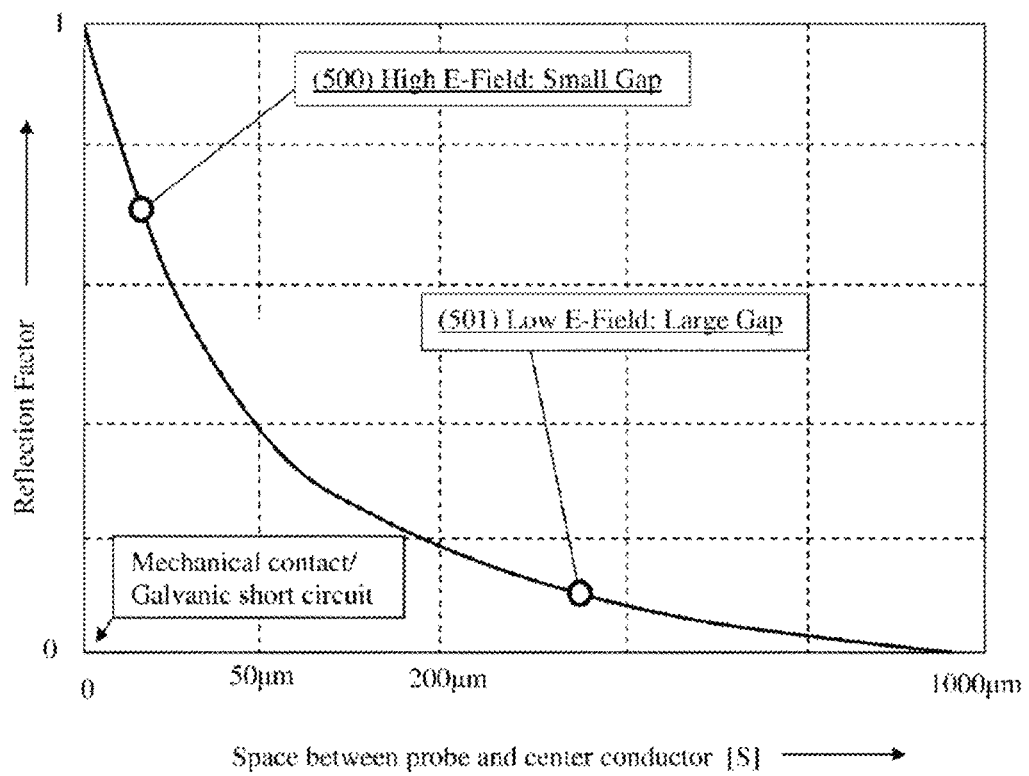
FIG. 10 depicts prior art, the dependence and increasing sensitivity of the reflection factor on the proximity of the tuning slug to the center conductor.

The horizontal control of the carriages 70, 71 (FIG. 7) is best accomplished using linear electric actuators (see ref. 6) or stepper motors 72, 73 and associated horizontal ACME rods 74, 75. Since the tuner does not have adjustable vertical axis, not being able to withdraw the tuning probes from the slabline, means that another way is needed: this is made possible by bending 56, 57 the center conductor in a stretched and shallow basic "S" shape close to the coaxial connectors of the tuner ports. This then allows to move the tuning probes to the neutral positions 54A and 55A, where the capacitive coupling with the center conductor 51 vanishes and so does the residual reflection factor. The center conductor is bent in the plan of the channel of the slabline staying always at the same distance from the sidewalls 80; since the characteristic impedance, even at differential AX level, is defined by the ratio of the channel width and the center conductor diameter, as long as the bending shape is smooth enough and the electro-magnetic field is not overly deviating from the predominant coaxial TEM propagation mode, the transmission and residual reflection perturbation is negligible (FIG. 10) and, at least, below the threshold needed for a tuner slabline (a tuner works by creating reflection, perfect 50 Ohm matching is not a strict requirement).

Figure 4:
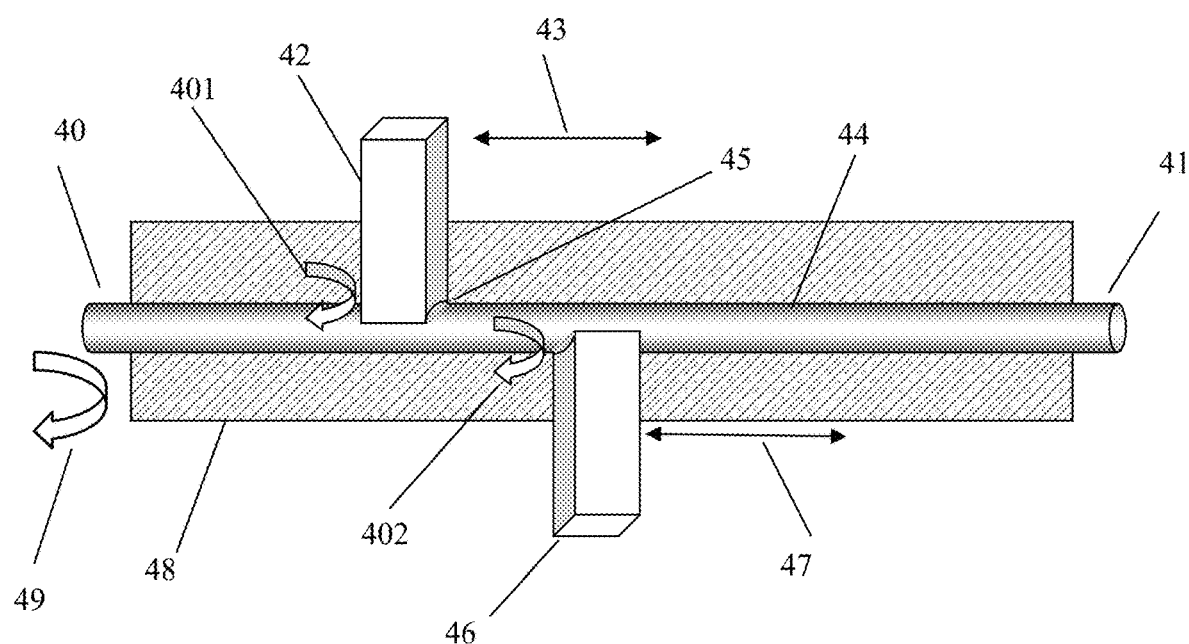
FIG. 4 depicts prior art, the concept of a shared-slabline fixed-penetration two-probe tuner without neutral state (50 Ohm) wideband capability.

The concept of a two-probe slide screw tuner with vertically fixed tuning probes is explained in prior art FIG. 4. The two slugs 42 and 46 move inside the channel of the slabline 48 along 43 without changing their penetration or at constant distance 45 from the center conductor 44. The reflection factor 49 at the input, or test, port 40 is created by vector superposition of the individual reflections 401 and 402 of each slug. Port 41 is idle and connected to auxiliary instruments. The test port 40 is connected to the DUT. The shortcoming of this configuration is that the reflection is present at all but a number of harmonic frequencies, that is only when the two vectors 401 and 402 are opposite at the test port and cancel each other; this also means that a 50 Ohm impedance can be generated (tuned to) individually at a frequency by properly positioning the slugs. The, otherwise, always present reflection creates risk of spurious oscillations of the DUT and, either catastrophic failure or, at least, wrong data. This invention solves this problem by bending the center conductor and allowing wideband 50 Ohm.

Figure 7:
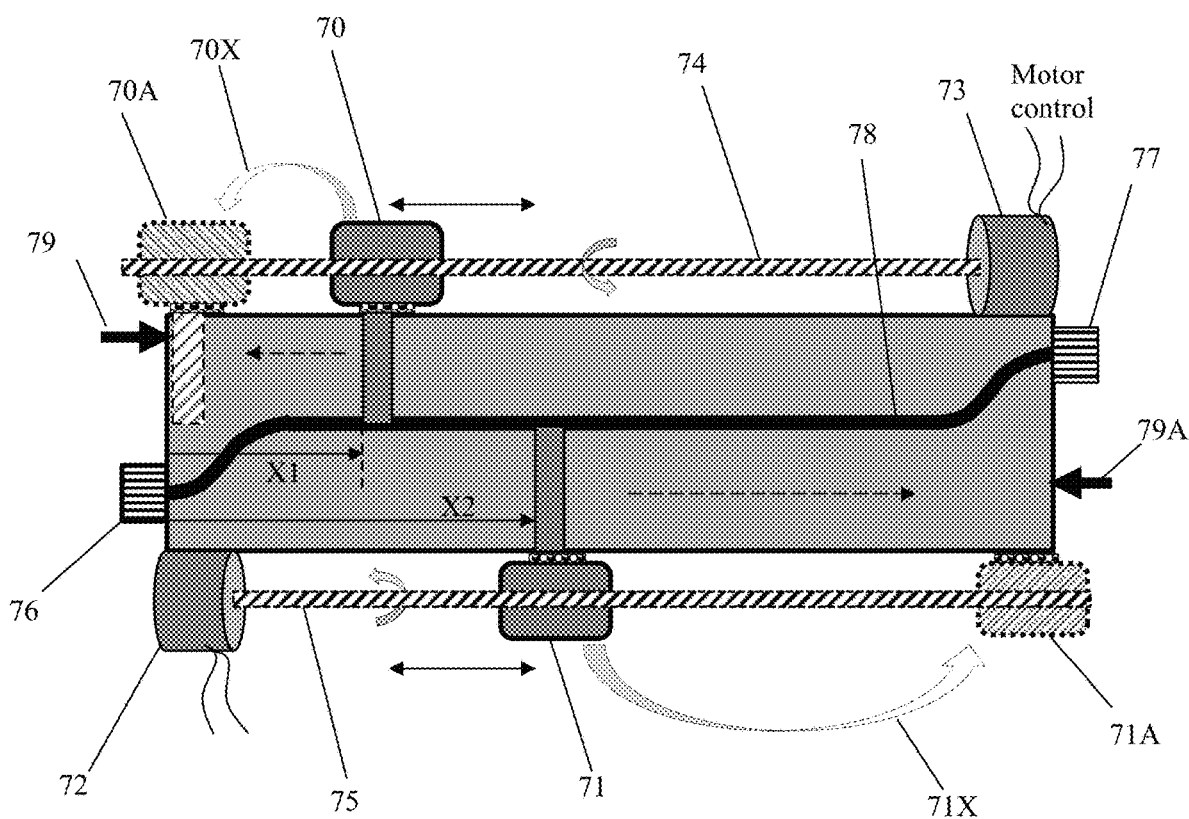
FIG. 7 depicts front view of shared-slabline fixed-penetration two-probe tuner with neutral initialization capability and the two probes in normal (full) and init (shaded) state.

The two-probe tuner with neutral initialization state is shown in FIG. 7: it includes an input (test) port 76 and an output (idle) port 77; the center conductor 78 is bent (twisted) at both ends terminating with coaxial connectors. The tuning probes 54, 55 (FIG. 5) are attached to mobile carriages 70 and 71, which slide or roll 84 on the top and bottom of the sidewalls 80 (FIG. 8) along the slabline. In this embodiment the carriages are threaded and controlled by ACME screws 74 and 75 controlled by remotely controlled stepper motors 72 and 73. The tuning probes are shown in two states: normal states 70 and 71 and neutral states 70A and 71A; the moves 70X and 71X from states 70, 71 to states 70A, 71A are the initialization moves. In real operation, since the horizontal coordinates X1 and X2 are measured from the test port 76, then initialization of probe #2 occurs, when the probe #2 (71) is at position 71A or X2=λ(Fmin)/2 plus two bents. The span B of the bents (FIG. 5) depends on the mechanical layout and is such that, when the probe is in the extreme outside position the coupling with the center conductor is insignificant; typically, this distance is no more than 2× the center conductor diameters. The initialization positions are detected using limit switches 79 and 79A.

Cascading two tuners (FIG. 6) creates a two-frequency or harmonic tuner, the equivalent of the pre-matching tuner (see ref. 4); however, due to the slightly increased insertion loss of the first bent, closest to the DUT, the main application would be two frequency harmonic tuning using existing algorithms (see ref. 8). The two slablines 60 and 61 are joined at position 62 and the four probes 63 are moved and initialized as in the single tuner; the calibration is also adapted by redefining the coordinates X1 to X4, and the associated positions, all referred to the test port and applying the cascading de-embedding method of calibration. A full-scale calibration f this tuner is quasi-impossible due to the large number of probe permutations.

Figure 8:
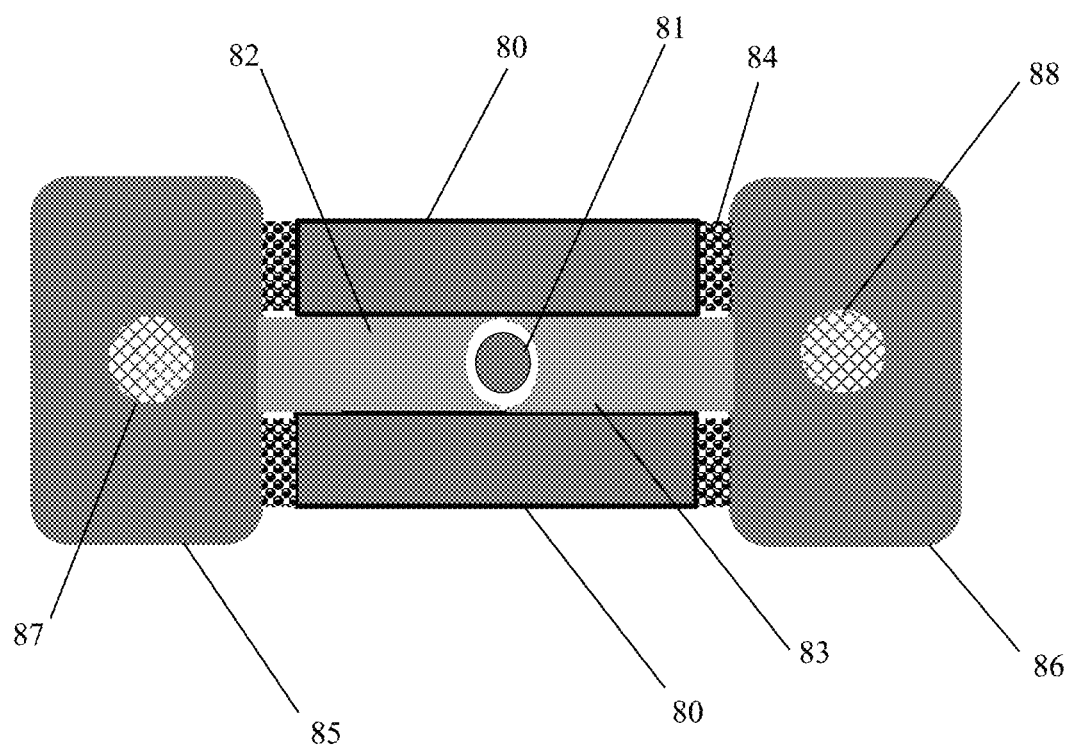
FIG. 8 depicts cross section of shared-slabline fixed-penetration two-probe tuner.
Figure 9:
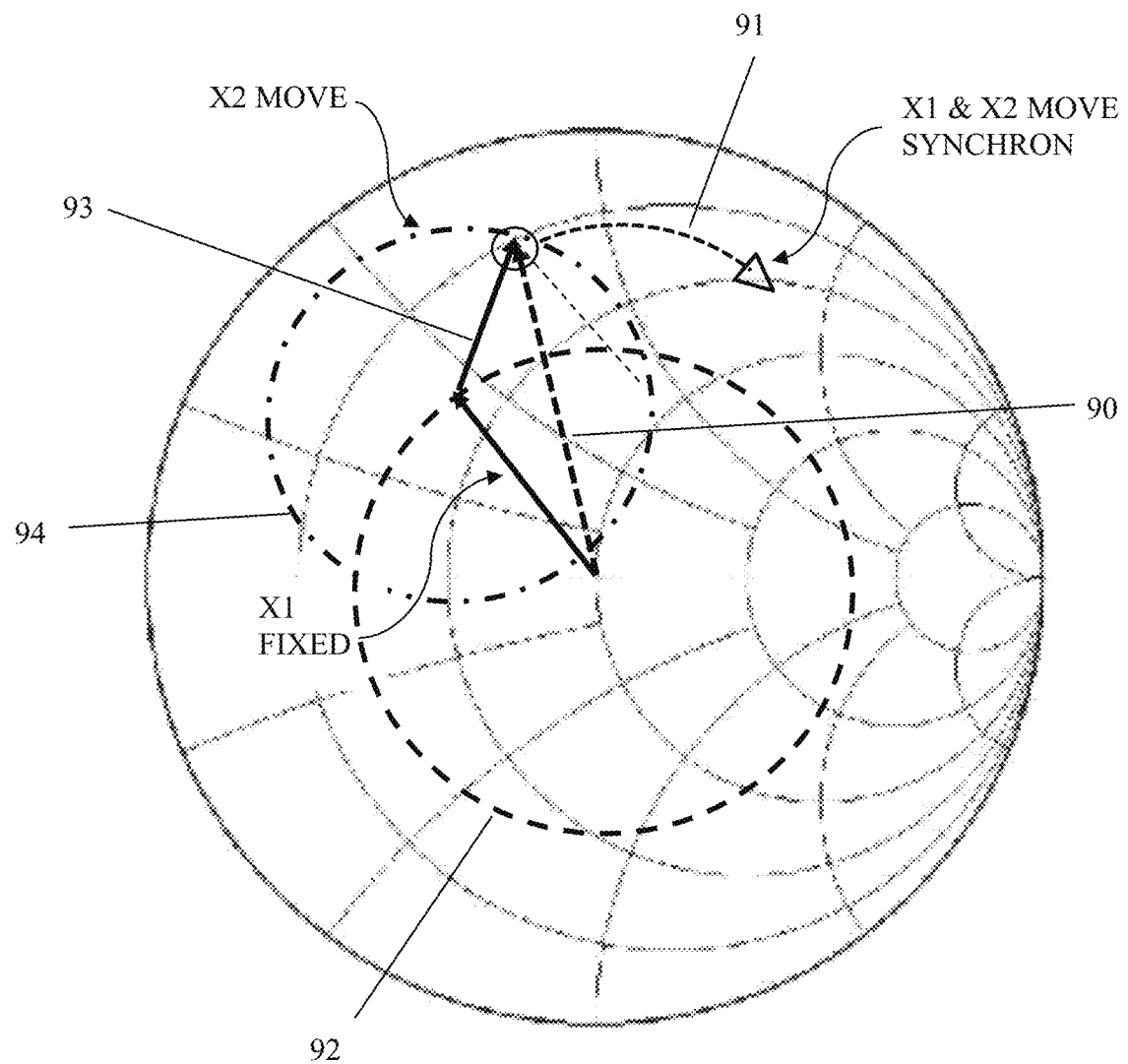
FIG. 9 depicts tuning mechanism of shared-slabline fixed-penetration two-probe tuner.

The cross section of the active zone (straight section of center conductor) is shown in FIG. 8: we see the flat profile tuner made up from the slabline 80, the two mobile carriages 86, rolling 84 on the slabline top and bottom walls 80, controlled by ACME screws 87 and 88 and holding the tuning probes 82 and 83 inserted at fixed depth close to the center conductor 81. This means the height of this tuner is given by the size of the stepper motors, typically 1.5 to 1.8", compared with 7 or 8" of traditional designs.

In FIG. 9 the reflection factor generation when both probes are in the active straight section of the "S" shaped center conductor is shown. Assuming probe #1 is closer to the test port, it generates a (fixed) vector 92; probe #2 creates a superimposed vector 93 which rotates around the tip of vector 92, following the trajectory 94, creates a total vector 90. If only probe #2 moves, then the total vector 90 follows trace 93; when both probes move together at the same pace, then the total vector 90 follows trace 91 and if they both move at different paces it follows a Lissajous contour.

Figure 11:
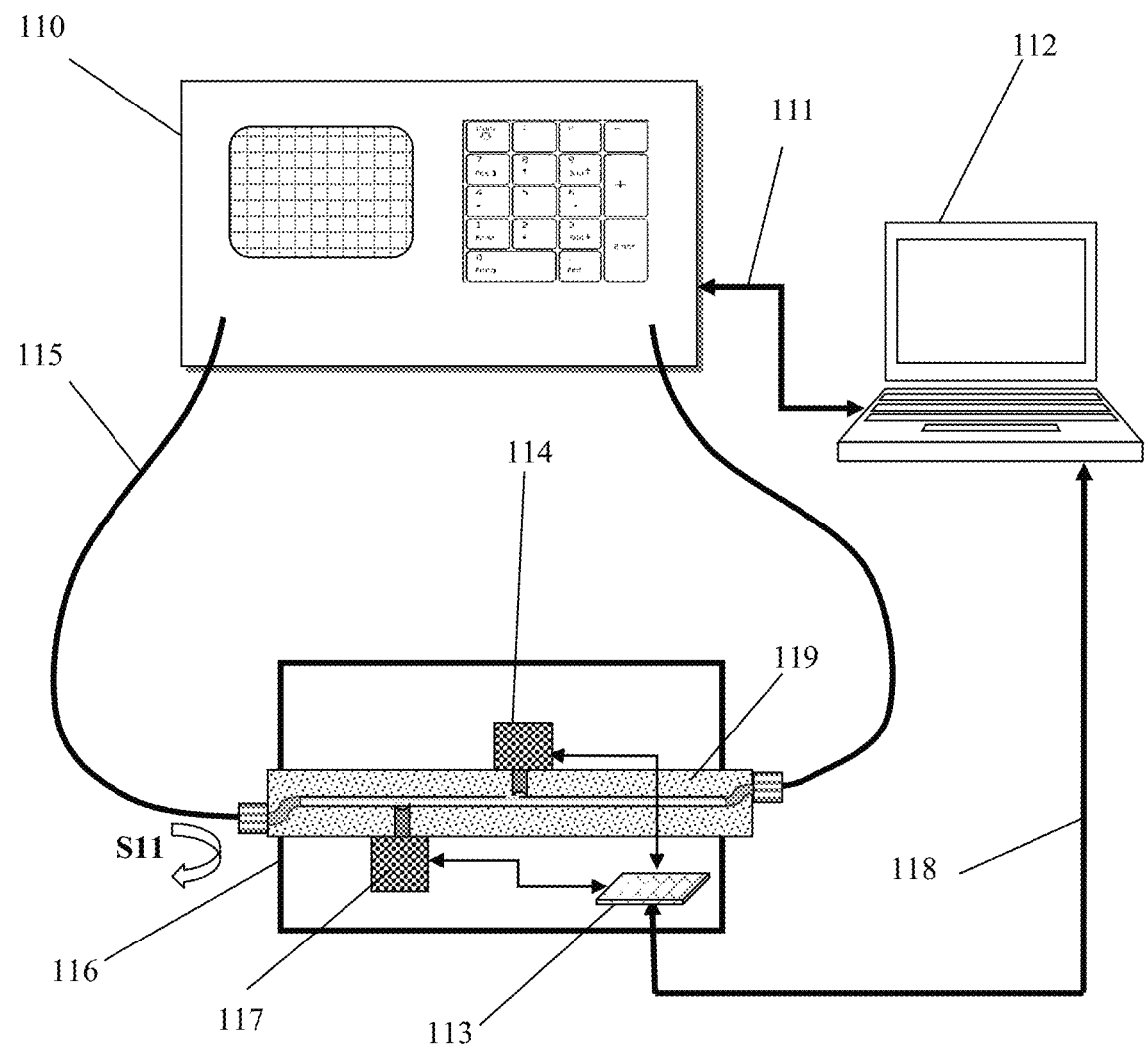
FIG. 11 depicts a calibration setup of the tuner.
Figure 12:
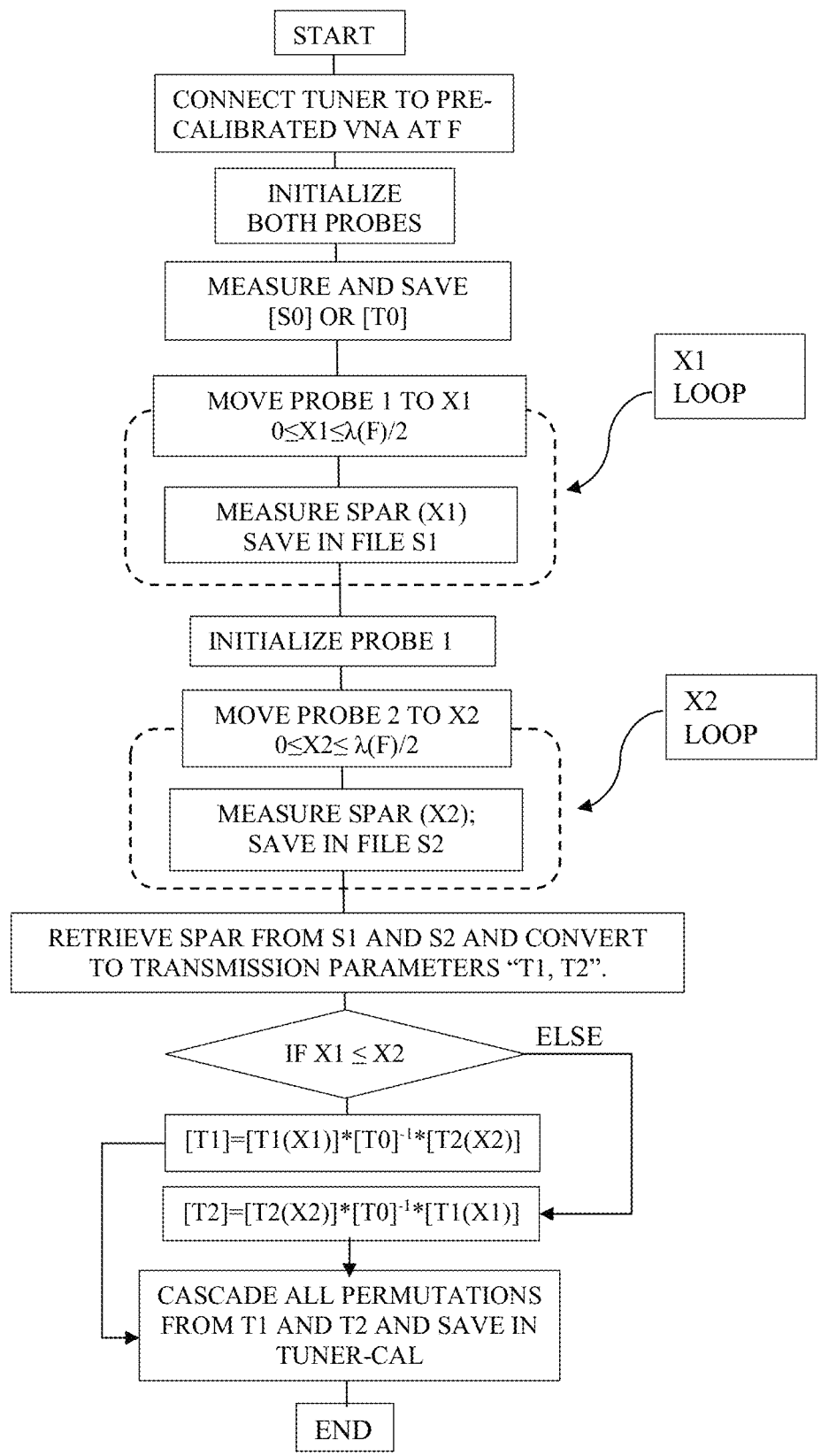
FIG. 12 depicts the flowchart of the de-embedding calibration algorithm of shared-slabline fixed-penetration two-probe tuner.

The tuner calibration process uses a setup as in FIG. 11 and is depicted, step by step, in the flowchart of FIG. 12: the tuner 116 is connected using RF cables 115 with a Vector Network Analyzer (VNA) 110 pre-calibrated at the frequencies of interest. The actuators 114 and 117 (see ref. 6) are controlled by the control computer 112 using a digital cable 118 via the electronic control board 113 to move the carriages 114 and 117, which slide along the axis of the slabline 119, in order to control the reflection factor S11, while reading the four scattering parameters (s-parameters) from the VNA 110 using standard, digital communication cable 111 and communication protocol. The computer 112 includes a temporary RAM and a permanent (hard-disc) electronic memory for saving probe positions and the associated s-parameters in calibration data files for later use. The PC controller 112 also includes and runs appropriate tuner and VNA control and communication software as well as appropriate numerical data processing (s-parameter matrix conversion and cascading) routines.

The fast de-embedding calibration procedure comprises the following steps (FIG. 12): After the tuner is connected to the VNA, pre-calibrated at a selected frequency F inside the operation range of the tuner, both tuning probes are initialized (moved to positions 54A and 55A); this leaves the residual slabline (tuner) between the input and output ports. S-parameters of the residual tuner are measured and saved in a zero matrix [S0]. Then the first tuning probe #1 is moved along the slabline to a multitude of positions X1 between the initialization position (X1=B) and one half of a wavelength away W2+B at the selected frequency F and s-parameters are measured and saved, together with the position X1 in a first data file S1. Subsequently the tuning probe #1 is initialized (moved to position 54A) and tuning probe #2 is moved from the init position 55A, corresponding to X2=N/2+2B to X2=B in a multitude of positions X2 and at every step s-parameters are measured and saved in a second data file S2 together with the position X2.

At last the s-parameters of files S1 and S2 are retrieved and the tuner calibration file TUNER_CAL is created as follows: if X1 is smaller than X2, that is tuning probe #1 is closer to the input port, then the s-parameters of file S2 are converted to ABCD format, cascaded with $[S0]^{-1}$ (see ref. 9) and re-saved in file S2; if X1 is larger than X2, i.e., probe #2 is closer to the input port than probe #1, then it is the s-parameters of file S1 that are cascaded with $[S0]^{-1}$ and resaved in file S1; at last s-parameters associated with all permutations of probe #1 and probe #2 positions saved in files S1 and S2 are cascaded and saved in a tuner calibration file TUNER_CAL using the format (X1, X2, Sij).

Alternatively, instead of measuring the initialization matrix [S0] and de-embedding each probe s-parameter as before, a full-scale calibration can be performed, in which s-parameters are measured for all X1 and X2 permutations and saved using the same format (X1, X2, Sij). This method, though takes a multiple of time to execute.

Obvious alternatives to the disclosed concept of a low-profile load pull tuner with two independent fixed-insertion, diametrically mounted and sharing the same slabline, tuning probes with neutral state capability but without adjustable vertical axis, using a double-bent center conductor, shall not impede on to the validity of the present invention.

What is claimed is:
1. A load-pull tuner comprising
   a low loss slotted airline (slabline) having an input port, an output port, two sidewalls forming a channel, an "S" shaped center conductor and
   two remotely controlled mobile carriages #1 and #2, saddled facing each-other on the sidewalls across the channel, each said carriage holding a metallic tuning probe, which it keeps inserted in the channel at fixed penetration and moves along the slabline, said tuning probe being capacitively coupled with the center conductor, carriage #1 holding tuning probe #1 and carriage #2 holding tuning probe #2, wherein
   the "S" shaped center conductor resides in its entire length at equal distance between the sidewalls of the slabline and has a straight center section between two end bends which are terminated with coaxial connectors, the first bend at the input port and the second bend at the output port, each said bend having a span B;
   and wherein
   the metallic tuning probes are inserted diametrically into the channel at fixed distances from the center conductor, sharing the slabline and capable of crossing over;
   and wherein
   carriage #1 moves the tuning probe #1 to a position X1 and
   carriage #2 moves the tuning probe #2 to a position X2 along the slabline.
2. The load-pull tuner of claim 1, wherein the straight center section of the center conductor is at least one half of a wavelength long at a minimum frequency of operation of the load-pull tuner.

3. The load-pull tuner of claim 1,
wherein
the carriages slide along the slabline between the input port and the output port controlled by stepper motors, drive screws and gear and are initialized using limit switches.

4. The load-pull tuner of claim 1,
wherein
the metallic tuning probes, when not initialized, are capacitively coupled with the center conductor.

5. The load-pull tuner of claim 1,
wherein
carriage #1 is initialized adjacent to the input port before the first bend and carriage #2 is initialized adjacent to the output port beyond the second bend, where either tuning probe is uncoupled with the center conductor.

6. A calibration method performed using the load-pull tuner of claim 5, comprising the following steps:
 a) connect the load-pull tuner to a pre-calibrated vector network analyzer at a frequency F;
 b) initialize both tuning probes;
 c) measure s-parameters and save in a zero matrix [S0];
 d) in a tuning probe movement and s-parameter measurement loop:
  move the tuning probe #1 to a multitude of positions X1 with X1 larger or equal to B and smaller or equal to $\lambda(F)/2$ plus B, measure s-parameters Sij with $\{i, j\}= \{1,2\}$ and save (X1, Sij) in a file S1;
 e) initialize the tuning probe #1;
 f) in a tuning probe movement and s-parameter measurement loop:
  move the tuning probe #2 to a multitude of positions X2 with X2 larger or equal to B and smaller or equal to $\lambda(F)/2$ plus B, measure s-parameters Sij with $\{i, j\}= \{1,2\}$ and save (X2, Sij) in a file S2;
 g) retrieve s-parameter and probe position data from files S1 and S2;
  if (X1≤X2) then
   cascade the invers s-parameter zero matrix $[S0]^{-1}$ with the s-parameters of file S2 and replace in file S2;
  else if (X1>X2) then
   g3) cascade the invers s-parameter zero matrix $[S0]^{-1}$ with the s-parameters of file S1 and replace in file S1;
 h) cascade the s-parameters of file S1 with the s-parameters of file S2 and save (X1, X2, Sij) in a file TUNER-CAL;
 i) terminate.

7. A calibration method performed using the load-pull tuner of claim 5, comprising the following steps:
 a) connect the load-pull tuner to a pre-calibrated vector network analyzer at a frequency F;
 b) in a tuning probe movement s-parameter measurement loop:
  i) in a first nested loop, move tuning probe #1 to a multitude of positions X1, with B≤X1≤$\lambda(F)/2$ plus B;
  ii) for each position X1 of tuning probe #1:
   in a secondary nested loop, move probe #2 to a multitude of positions X2, for B≤X2≤$\lambda(F)/2$ plus B
  iii) measure s-parameters Sij with $\{i, j\}= \{1,2\}$;
  iv) save (X1, X2, Si,j) in file TUNER-CAL;
   when the secondary nested tuning probe #2 loop terminates, increase X1 and go to step i);
 c) when the first loop i) terminates, save file TUNER-CAL.

* * * * *